US 6,709,985 B1

(12) United States Patent
Goruganthu et al.

(10) Patent No.: US 6,709,985 B1
(45) Date of Patent: Mar. 23, 2004

(54) ARRANGEMENT AND METHOD FOR PROVIDING AN IMAGING PATH USING A SILICON-CRYSTAL DAMAGING LASER

(75) Inventors: Rama R. Goruganthu, Austin, TX (US); Michael R. Bruce, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 369 days.

(21) Appl. No.: 09/383,781

(22) Filed: Aug. 26, 1999

(51) Int. Cl.[7] .............................................. H01L 21/302
(52) U.S. Cl. ........................ 438/706; 438/714; 438/719
(58) Field of Search ................................. 438/166, 706, 438/719, 308, 714

(56) References Cited

U.S. PATENT DOCUMENTS

| | | | | |
|---|---|---|---|---|
| 5,786,242 A | * | 7/1998 | Takemura et al. | 438/166 |
| 5,808,350 A | * | 9/1998 | Jack et al. | 257/440 |
| 5,851,860 A | * | 12/1998 | Makita et al. | 438/166 |
| 5,854,096 A | * | 12/1998 | Ohtani et al. | 438/166 |
| 6,008,101 A | * | 12/1999 | Tanaka et al. | 438/308 |
| 6,014,965 A | * | 1/2000 | Nishida | 125/12 |
| 6,107,107 A | * | 8/2000 | Bruce et al. | 438/14 |

* cited by examiner

Primary Examiner—Nadine G. Norton
Assistant Examiner—Binh X Tran

(57) ABSTRACT

According to one aspect of the disclosure, laser-thermal annealing is used to clear an imaging path through the back side of a semiconductor device after the back side of the chip has been thinned to expose a selected region in the substrate. For many applications, thinning results in the formation of crystal defects that inhibit the ability to obtain images through the back side of the semiconductor device. One example embodiment overcomes this problem by thinning via laser-chemical etching the back side of the semiconductor device under a pressure exceeding a threshold level, and then reducing the pressure to a level below the threshold level and scanning the back side of the semiconductor device using a laser at a reduced power level. IR microscopy is then used to capture an image of a circuit in the circuit side of the semiconductor device through the back side of the semiconductor device. One particular example application is directed to a flip-chip semiconductor device. Another aspect of the invention is directed to clearing collision-induced viewing impairments, as may be caused by plasma etching.

15 Claims, 2 Drawing Sheets

ARRANGEMENT AND METHOD FOR PROVIDING AN IMAGING PATH USING A SILICON-CRYSTAL DAMAGING LASER

FIELD OF THE INVENTION

The invention relates to semiconductor device assemblies, and more particularly to techniques for analyzing and debugging circuitry associated with a flip-chip bonded integrated circuit.

BACKGROUND OF THE INVENTION

In recent years, the semiconductor industry has seen tremendous advances in technology that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

There have been a number of semiconductor packaging types used to increase the number of pad sites available for a die and to address other problems. One increasingly popular packaging technique is called controlled collapse chip connection or flip-chip packaging. In this technology, the bonding pads are provided with metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads and soldered. As a result, the dies are often referred to as "flip-chip" devices. Each bump connects to a corresponding package inner lead. The packages that result are lower profile and have lower electrical resistance and a shortened electrical path.

The output terminals of such packages vary, depending on the package type. For example, some output terminals are ball-shaped conductive bump contacts (usually solder, or other similar conductive material), and they are typically disposed in a rectangular array. These packages are occasionally referred to as "Ball Grid Array" (BGA). Another type of package, commonly known as pin grid array (PGA) package, implements the output terminals as pins.

Once the die is attached to the package, the back side portion of the die remains exposed. The transistors and other circuitry are generally formed in a very thin epitaxially grown silicon layer on a single crystal silicon wafer from which the die is singulated. The portion of the die that includes the epitaxial layer, which contains the transistors and other active circuitry, is often referred to as the circuit side of the die or the front side of the die. The circuit side of the die is positioned very near the package, and opposes the back side of the die. Between the back side and the circuit side of the die is single crystalline silicon.

The positioning of the circuit side provides many of the advantages of the flip-chip device. However, in some instances the orientation of the die with the circuit side face down on a substrate may be a disadvantage or present new challenges. When a circuit fails, when circuit testing is desired, or when it is necessary to modify a particular chip, access to the transistors and circuitry near the circuit side is obtained only from the back side of the chip. This is challenging since the transistors are in a very thin layer (e.g., about 10 micrometers) of silicon buried under the bulk silicon (e.g., greater than 500 micrometers). Thus, the circuit side of the flip-chip die is not visible or accessible for viewing using optical or scanning electron microscopy.

Although the circuit of the integrated circuit (IC) is buried under the bulk silicon, infrared (IR, hereinafter including both IR and also near-infrared (nIR) where the wavelength is between 800 and 2000 nm) microscopy is capable of imaging the circuit because silicon is relatively transparent in these wavelengths of the radiation. However, because of the absorption losses of IR radiation in silicon, it is generally required to thin the die to less than about 200 microns in order to view the circuit using IR microscopy. To illustrate this difficulty, on a die that is 725 microns thick, this means removing (or thinning) at least 625 microns of silicon before IR microscopy can be used.

Thinning a flip-chip bonded die for failure analysis can be time consuming and burdensome. According to one common approach, thinning is accomplished in two or three steps. First, the die is thinned across the whole die surface. This is also referred to as global thinning. Global thinning is done to allow viewing of the active circuit from the back side of the die using IR microscopy. Mechanical polishing is one method for global thinning. Mechanical polishing can be done keeping the surface fairly flat across the die surface. This process can also produce very smooth surfaces to obtain clear images using IR (including nIR) microscopy. Too high a surface roughness causes scattering of illumination light and the reflected light from the surface being imaged. Once an area is identified as an area of interest and it is determined that access is needed to a particular area of the circuit, local thinning techniques can be used to thin an area smaller than the die size. Laser microchemical etching of silicon is one method of local thinning.

A particular problem is encountered attempting to image the circuit beneath the trench surface created by laser chemical etching (LCE). In laser chemical etching, a focussed laser beam is scanned over a small area on the silicon surface of the die in the presence of chlorine gas. The focussed laser beam is absorbed in silicon and the surface gets heated to a very high temperature. The heat caused by the laser beam is generally high enough to cause melting of the silicon surface. The chlorine gas reacts with the hot silicon surface or molten silicon and forms volatile silicon chloride. The unreacted molten silicon re-crystallizes and forms the silicon surface. Although this process produces fairly smooth surfaces, the surface resulting after LCE destroys the imaging process.

The surface resulting after laser chemical etching is found to have crystal defects using TEM (Transmission Electron Microscopy) mainly dislocations and threading defects which are not present in the starting material. These crystal defects serve as scattering centers for light and are believed to be the cause for the imaging problems. Additionally the surface formed in the LCE process causes some degree of amorphization (the surface being composed of very small size grains) of silicon.

SUMMARY OF THE INVENTION

The present invention is directed to imaging circuit regions through a silicon surface that was impaired by thinning. In connection with the present invention, it has been discovered that impairment by crystal defects can be overcome for circuit-viewing by laser-thermal annealing. Such annealing is useful in overcoming crystal-defect impairment as caused by multiple types of thinning processes.

According to one example embodiment, the back side of a semiconductor device, such as a flip-chip semiconductor device, is thinned to expose a selected region in the substrate. An imaging path is then provided through the back side of a semiconductor device for subsequently obtaining an image of circuitry as viewed from the back side. The imaging path can be provided using any of various mechanisms including, for example, conventional global and local thinning techniques. Specifically, silicon thinning that uses a laser chemical etching process results in the formation of crystal defects that inhibit the ability to obtain images through the back side of the semiconductor device. This problem is addressed by a combination of a surface smoothing process and an annealing step to reduce the crystal defects in silicon. The present invention overcomes this problem by reducing, e.g., smoothing, the crystal defects.

In a more particular embodiment, the imaging path is provided by thinning via laser-chemical etching the back side of the semiconductor device under a pressure exceeding a threshold level, and then reducing the pressure to a level below the threshold level and scanning the back side of the semiconductor device using a laser. IR microscopy is then used to capture an image of a circuit in the circuit side of the semiconductor device through the back side of the semiconductor device.

In another example embodiment, the present invention is directed to a system for providing an imaging path for imaging through the back side of a semiconductor device to its circuit side. The system includes: a laser-chemical etching arrangement including a laser-chemical etcher configured and arranged to apply a high temperature to the back side of the semiconductor device and to thin the back side at a first energy level, the laser-chemical etching arrangement further including an adjustment to use the laser-chemical etcher for scanning the back side of the semiconductor device in the imaging path and at an energy level that is less than the first energy level and for reducing crystal defects in the imaging path; and a microscopy arrangement configured and arranged to apply light through the imaging path and to obtain images of circuitry in the circuit side of the semiconductor device. In a more particular example embodiment, the system further includes a gas chamber and the adjustment is configured and arranged to change pressures within the chamber from a first pressure in excess of about one milli-Torr to a second pressure that is less than about one milli-Torr.

According to another example embodiment, the back side of a die is globally thinned via plasma etching, and crystal defects resulting therefrom are overcome for viewing underlying circuit material by laser-thermal annealing.

The above summary is not intended to describe each illustrated embodiment or every implementation of the present invention. The figures and the detailed description which follow more particularly exemplify these embodiments.

BRIEF DESCRIPTION OF THE DRAWINGS

The following detailed description can best be understood when read in conjunction with the following drawings, in which.

Figure 1:
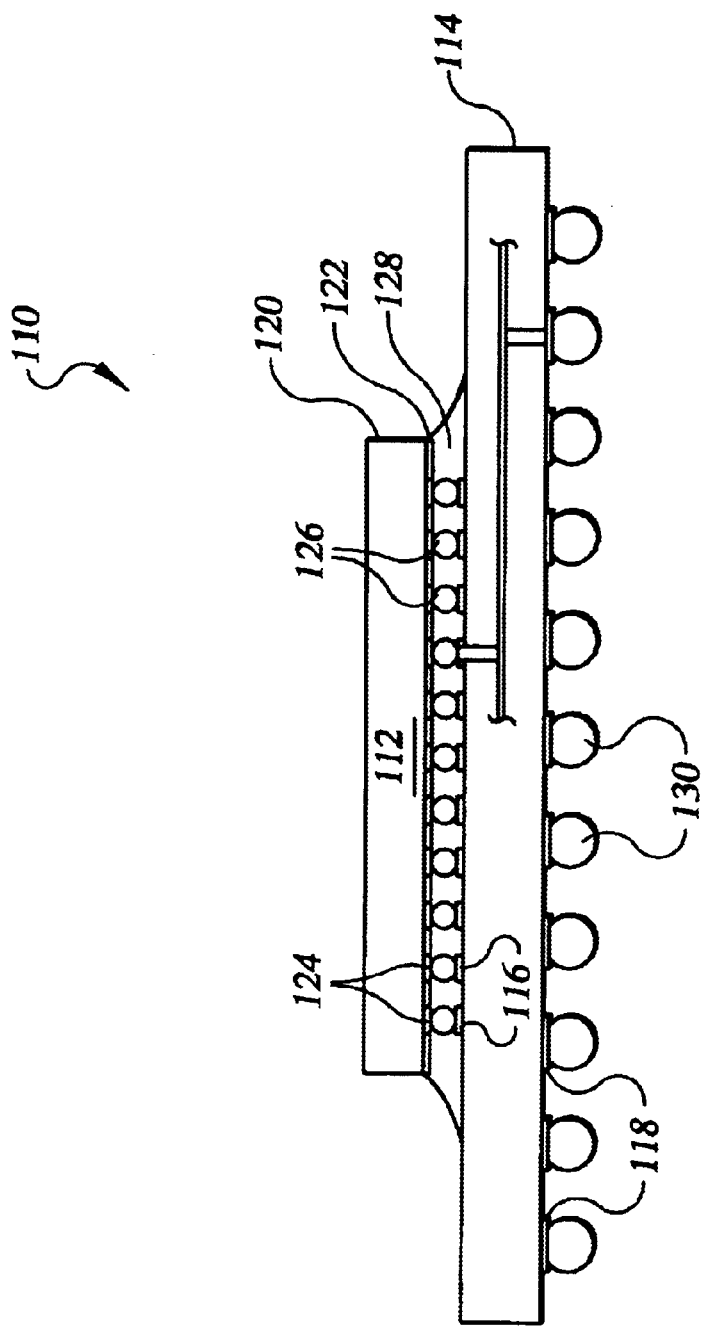
FIG. 1 shows a side view of a conventional integrated circuit packaged as a flip-chip device.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chip type circuit packages. While the present invention is not limited to flip-chip type circuit packages, an appreciation of various aspects of the invention is best gained through a discussion of various examples using this application.

According to a particular example embodiment of the present invention, a conventional die, such as the die of a flip-chip type device or a normally-oriented packaged die, is tested after creating an imaging path through the back side of a semiconductor device. The back side of a semiconductor device (also referred to as a die or integrated circuit) is first thinned to expose a selected region over suspect circuitry. For many applications, thinning results in the formation of crystal defects that inhibit the ability to obtain images through the back side of the semiconductor device. One example embodiment overcomes this problem by thinning via laser-chemical etching the back side of the semiconductor device under a pressure exceeding a threshold level, and then reducing the pressure to a level below the threshold level and scanning the back side of the semiconductor device using a laser. IR microscopy is then used to capture an image of a circuit in the circuit side of the semiconductor device through the back side of the semiconductor device. The suspect circuitry may be then further analyzed using microscopy techniques and may even be modified via the imaging path.

FIG. 1 shows a side view 110 of one type of conventional flip-chip type die 112 assembled to a package substrate 114. Flip-chip die 112 has a back side 120 and a circuit side in a portion of the die known as the epitaxial layer 122. The epitaxial layer 122 includes a number of circuit devices and has a thickness in the range of one to fifteen microns. Bulk polysilicon fills the back side 120 and is referred to as the bulk polysilicon layer. A plurality of solder bumps 126 are made on the circuit side at pads 124. The solder bumps 126 are the inputs and outputs to the circuitry associated with the flip-chip type die 112. The flip-chip type die 112 is attached to the package substrate 114 via the solder bumps on the die 112. The package substrate 114 includes pads 116 that are arranged to correspond to the pattern of solder bumps 126 on the die 112. The region between the die 112 and package substrate 114 is filled with an under-fill material 128 that encapsulates the solder bump connections and provides additional mechanical benefits. The pads 116 are coupled via circuitry to pads 118 on the package substrate, and solder bumps 130 are formed on the pads 118. The solder bumps 130 are the inputs and outputs to the circuitry associated with the package substrate 114.

For a flip-chip type die such as die 112 of FIG. 1, failure analysis of a flip-chip bonded IC is usually accomplished using a global and/or local thinning process involving, for example, a process that mechanically polishes and laser-microchemically etches with the thinning process resulting in the formation of crystal defects that inhibit the ability to obtain images through the back side, as previously discussed.

Figure 2:
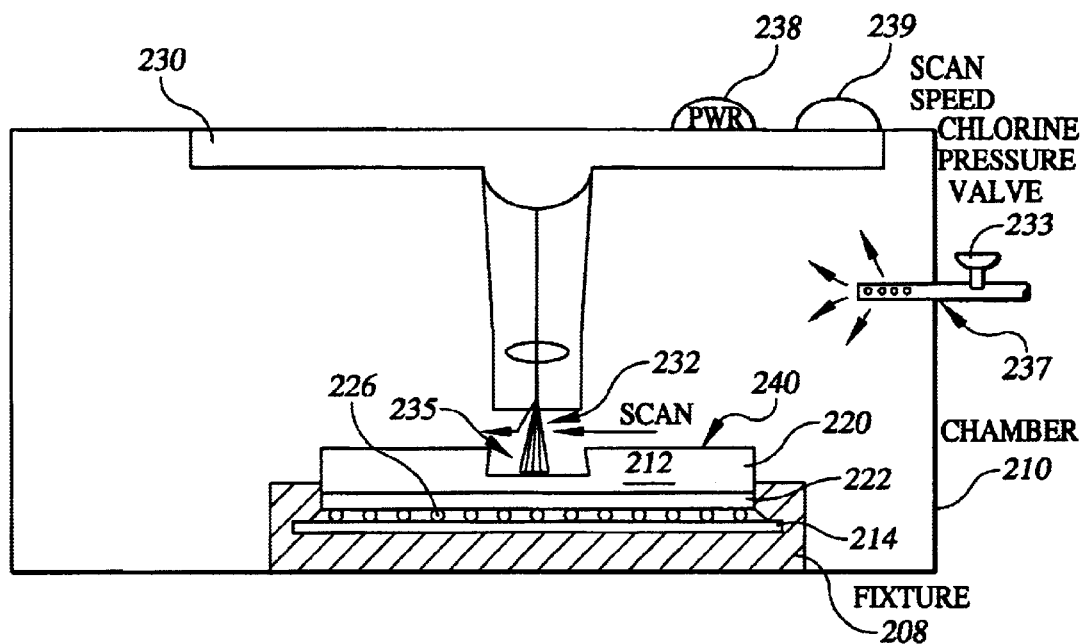
FIG. 2 shows a side view of an arrangement for thinning the integrated circuit of FIG. 1 and for providing an imaging path via a back side of the flip-chip die, according to the present invention.
Figure 3:
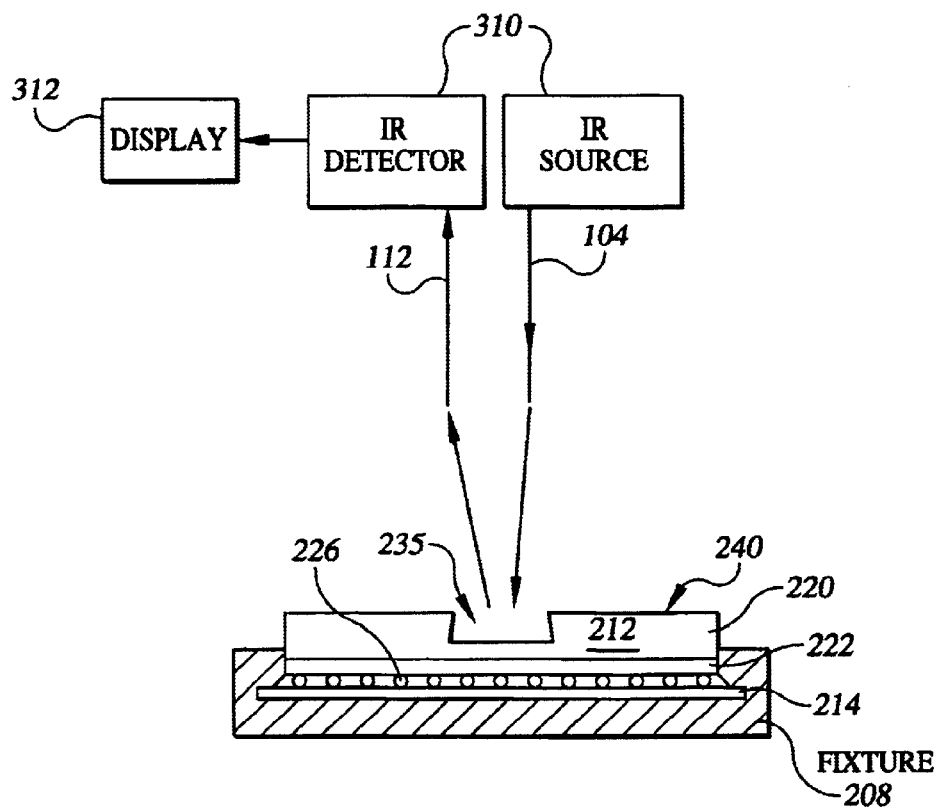
FIG. 3 shows a side view of an arrangement for capturing images using the imaging path referred to in connection with FIG. 2, also according to the present invention.

FIGS. 2 and 3 show a schematic view of an example thinning/test system in which a substrate 220 of a flip-chip type die 212, as attached to a package substrate 214, is secured in a fixture 208 within a chamber 210. The system includes a laser-chemical etching apparatus 230 for thinning the die 212 by removing portions of the back side 220 of the die 212. The laser-chemical etching apparatus 230 produces a laser beam 232 which, in the presence of a gas that is reactive with the substrate, can be used to locally or globally thin the die, such as to remove silicon across a selected portion of, or the entire back side of, surface 240. The reactive gas may be, for example, xenon difluoride or chlorine. In the example system of FIG. 2, the reactive gas is chlorine provided by way of gas-input port 237 to the chamber 210 and is scanned to create an aperture or trench 235. The trench 235 in this illustrated example application provides a locally-thinned portion of the die 12. In another application, the back side 220 is globally thinned to remove the surface 240 entirely. 20 In another embodiment, a polisher (chemically-based and/or mechanically-based) achieves global thinning and a trench, such as trench 235, is formed using the laser-chemical etching apparatus 230 of FIG. 2. An example laser-chemical etching apparatus that can be used in this application is a laser chemical etcher (LCE), manufactured and sold by Revise, Inc.

After the back side 220 of the die 212 is thinned over a selected region or certain circuitry (or circuit material) within the substrate, the laser-chemical etching apparatus 230 is used with the reactive gas to smooth the newly formed surface at the thinned region. The laser beam 232 produced by the laser-chemical etching apparatus 230 produces a localized high temperature that induces the formation of crystal defects. As discussed above, these crystal defects inhibit the ability to obtain images, such as images normally obtained using IR microscopy, through the back side of the semiconductor device. The newly formed surface at the thinned region is smoothed by the laser-chemical etching apparatus 230 to reduce, or even substantially remove, these defects.

In connection with the present invention, it has been discovered that one way to realize this smoothing after laser-chemically etching the back side 220 of the semiconductor device under a first chamber pressure (e.g., exceeding a threshold level) and at a first power level (e.g., about 4 watts), involves reducing the pressure (or even evacuating the chamber pressure) and then laser scanning the back side of the semiconductor device in vacuum (e.g., at about the first pressure) and at a reduced power level (e.g., about 3 watts). This reduced power scan clears or smooths the target surface. Then, to laser anneal this region, another laser scan is applied in vacuum at about the first power level (e.g., about 4 watts).

According to a more particular embodiment, the system of FIG. 2 provides the imaging path by first thinning the back side 220 of the semiconductor device at a chamber pressure greater than about 1 milli-Torr. The chamber pressure is removed and then the back side of the semiconductor device scanned to smooth the trenched surface bottom. The laser-chemical etching apparatus 230 of FIG. 2 includes adjustment controls 238 and 239 for respectively adjusting the power and scan speed of the laser-chemical etching apparatus 230. The gas-input port 237 to the chamber 210 of FIG. 2 includes a valve 233 for reducing the chamber pressure.

FIG. 3 illustrates the die 212, after the thinned region has been smoothed as described above and with an unimpeded imaging path through the back side of the semiconductor device for IR microscopy. An IR microscopy apparatus, including an infrared transmitter/receiver 310 and a monitor 312, is used to capture an image of a circuit in the circuit side of the die 212 through its back side 220. An example IR microscopy apparatus that can be used in this application is a confocal laser scanning microscopy, manufactured and sold by Zeiss, Inc.

In an alternative embodiment, an apparatus within a chamber can include both a laser-chemical etcher (such as apparatus 230) and an infrared transmitter/receiver so that a die secured beneath the laser-chemical etcher can be thinned, smoothed and then imaged without removing the die from the fixture securing the die within the chamber.

After thinning and smoothing, images are obtained to further evaluate the circuit side of the die. Using these images, other electrical signal measurements can be made through the use of a conventional test fixture.

In another example embodiment, plasma etching is used rather than laser-chemical etching. The back side of the die is first globally thinned by a plasma etching process, and collision-induced damage at the target surface is cleared or smoothed by locally or globally laser-thermal annealing in vacuum at a substantial power level,. e.g., about 4 watts.

The present invention is amenable to various modifications and alternative forms that depart from the exact specifics shown by way of example in the drawings and the particular embodiments described above. The invention is to cover modifications, equivalents, and alternatives falling within the spirit and scope of the invention as defined by the appended claims.

What is claimed is:

1. A method for providing an imaging path in a semiconductor device having a circuit side underlying silicon material, the method comprising:
   etching away some of the silicon material and forming a target surface; and
   laser-thermal annealing the silicon material by laser-scanning the target surface, and therein clearing a viewing path under the target surface.

2. A method for providing an imaging path in a semiconductor device, according to claim 1, wherein etching includes plasma etching.

3. A method for providing an imaging path in a semiconductor device, according to claim 1, wherein etching includes laser-chemical etching.

4. The method of claim 1, further including arranging a microscope to receive images of circuit material in the semiconductor device through the viewing path, and receiving images of the circuit material in the semiconductor device through the viewing path.

5. The method of claim 1, wherein the underlying silicon material of the semiconductor device is a bulk silicon side opposite the circuit side.

6. A method for providing an imaging path that has been impaired by crystal defects formed as a result of applying a high temperature to the back side of the semiconductor device while thinning the back side using a laser at an energy level greater than or equal to a first energy level, the method comprising: scanning the back side of the semiconductor device using the laser applied at an energy level that is less than the first energy level and using the applied laser to reduce crystal defects.

7. A method for obtaining images via the back side of the semiconductor device, according to claim 6, wherein laser-chemical etching and scanning the back side of the semiconductor device are localized to target a portion of the circuit in the circuit side of the semiconductor device for imaging.

8. A method for reducing crystal defects, according to claim 6, wherein laser-chemical etching and scanning the back side of the semiconductor device are implemented to thin the back side of the semiconductor device at respective first and second etch rates, the first etch rate being greater than the second etch rate.

9. A method for providing an imaging path, according to claim 6, further including using light to image a portion of the circuit side through the back side of the semiconductor device after using the applied laser to reduce crystal defects.

10. A method for providing an imaging path, according to claim 9, wherein scanning the back side of the semiconductor device includes localized laser-etching the portion of the back side of the semiconductor device.

11. A method for providing an imaging path, according to claim 10, further including reducing a laser-etching pressure to a level that is less than about one milli-Torr before scanning the back side of the semiconductor device using a laser applied at an energy level that is less than the first energy level.

12. A method for providing an imaging path, according to claim 11, wherein scanning the back side of the semiconductor device using a laser further includes subjecting the back side of the semiconductor device to a chlorine gas environment.

13. For use with a semiconductor device having a circuit side and a back side, a method for obtaining images via the back side of the semiconductor device, the method comprising:

laser-chemical etching the back side of the semiconductor device in vacuum and at a first power level;

reducing the vacuum and scanning the back side of the semiconductor device using a laser operating at a power level that is less than the first power level; and using light to capture an image of a circuit through the back side of the semiconductor device.

14. A method for obtaining images via the back side of the semiconductor device, according to claim 13, wherein using light to capture an image through the back side of the semiconductor device includes applying IR light to a portion of the back side of the semiconductor device.

15. A method for obtaining images via the back side of the semiconductor device, according to claim 13, wherein reducing the pressure to a level below the threshold level and scanning the back side of the semiconductor device using a laser includes reducing crystal defects formed as a result of laser-chemical etching the back side of the semiconductor device.

* * * * *